(12) United States Patent
Ma et al.

(10) Patent No.: US 12,155,382 B2
(45) Date of Patent: Nov. 26, 2024

(54) PHASE LOSS DETECTION DEVICE, COMPRESSOR INCLUDING THE SAME, AND PHASE LOSS DETECTION METHOD

(71) Applicant: Danfoss (Tianjin) Ltd., Tianjin (CN)

(72) Inventors: He Ma, Tianjin (CN); Li Yao, Tianjin (CN); Guocun Li, Tianjin (CN); Bin Zhao, Tianjin (CN); Zhiwei Shang, Tianjin (CN); Yongjian Guo, Tianjin (CN)

(73) Assignee: DANFOSS (TIANJIN) LTD., Tianjin (CN)

( * ) Notice: Subject to any disclaimer, the term of this patent is extended or adjusted under 35 U.S.C. 154(b) by 420 days.

(21) Appl. No.: 16/811,301

(22) Filed: Mar. 6, 2020

(65) Prior Publication Data
US 2020/0287539 A1  Sep. 10, 2020

(30) Foreign Application Priority Data

Mar. 7, 2019 (CN) .......................... 201910174017.1

(51) Int. Cl.
*H03K 17/795* (2006.01)
*H02M 5/458* (2006.01)
*H02P 29/024* (2016.01)

(52) U.S. Cl.
CPC ........ *H03K 17/7955* (2013.01); *H02M 5/458* (2013.01); *H02P 29/0241* (2016.02); *H02P 29/0243* (2016.02)

(58) Field of Classification Search
CPC ............... H03K 17/7955; H02M 5/458; H02P 29/0241; H02P 29/0243; H02P 27/00;
(Continued)

(56) References Cited

U.S. PATENT DOCUMENTS 5,825,173 A  10/1998 Lim
8,219,334 B2  7/2012 Robinson et al.
(Continued)

FOREIGN PATENT DOCUMENTS

CN  101799520 A  8/2010
CN  101943719 A  1/2011
(Continued)

OTHER PUBLICATIONS

First Examination Report for Indian Patent Application No. 202014009776 dated Feb. 25, 2021.
(Continued)

*Primary Examiner* — Said Bouziane
(74) *Attorney, Agent, or Firm* — McCormick, Paulding & Huber PLLC

(57) ABSTRACT

A phase loss detection device, a compressor including the same, and a phase loss detection method are disclosed. The phase loss detection device may include a signal converting circuit and a processor. The signal converting circuit is configured to convert voltage signals corresponding to respective phases of multiphase alternating current (AC) power monitored from a motor. The processor is configured to receive the converted voltage signals from the signal converting circuit, and configured to calculate, based on the converted voltage signals, one or more phase angles between the respective voltage signals. The processor is configured to determine that phase loss occurs if any one or more of the calculated phase angles deviate from a nominal value of a corresponding phase angle of the multiphase AC power by a value higher than a predetermined threshold. The phase loss detection can be performed in a convenient, effective and reliable way.

20 Claims, 9 Drawing Sheets

(58) Field of Classification Search
CPC ....... G01R 29/16; G01R 31/343; F04B 35/04; H02H 7/09
See application file for complete search history.

(56) References Cited

U.S. PATENT DOCUMENTS

| | | |
|---|---|---|
| 2008/0116877 A1 | 5/2008 | Giubbini et al. |
| 2012/0075754 A1* | 3/2012 | Jayanth ................ F25B 49/005 361/25 |
| 2016/0087547 A1* | 3/2016 | Yamada .................. H02M 1/12 363/124 |
| 2018/0351497 A1* | 12/2018 | Osman .................... H02P 21/00 |
| 2019/0190267 A1 | 6/2019 | Cabaussel |

FOREIGN PATENT DOCUMENTS

| | | | | |
|---|---|---|---|---|
| CN | 104242785 A | | 12/2014 | |
| CN | 106249063 A | | 12/2016 | |
| CN | 106814262 A | | 6/2017 | |
| CN | 107664721 A | | 2/2018 | |
| CN | 108303604 A | * | 7/2018 | ............. G01R 29/16 |
| CN | 110095719 A | | 8/2019 | |
| EP | 1819021 A2 | | 8/2007 | |
| JP | 6157615 B2 | | 7/2017 | |

OTHER PUBLICATIONS

Hearing Notice for Indian Patent Application No. 202014009776 dated Dec. 27, 2023.

* cited by examiner

PHASE LOSS DETECTION DEVICE, COMPRESSOR INCLUDING THE SAME, AND PHASE LOSS DETECTION METHOD

CROSS-REFERENCE TO RELATED APPLICATION

This application claims foreign priority benefits under 35 U.S.C. § 119 to Chinese Patent Application No. 201910174017.1 filed on Mar. 7, 2019, the content of which is hereby incorporated by reference in its entirety.

TECHNICAL FIELD

The present disclosure generally relates to the field of electric motors, and more particularly, to a phase loss detection device, a compressor including the same, and a phase loss detection method.

BACKGROUND

Many electrical equipment, such as compressors, require phase loss detection during their operation in order to realize phase loss protection since motors may rotate reversely due to a voltage difference in a case of phase loss. Currently, the following two methods are commonly used for the phase loss detection. The first one is to detect the presence or absence of current signals of the motor to realize the phase loss detection for the compressor or motor at any time. However, this method requires an additional current sensor. The second one is to detect the presence or absence of voltage signals of the motor to realize the phase loss detection for the compressor or motor at start-up. However, the motor itself can generate an induced electromotive force during its operation, and thus some voltage signal of the motor can still be detected. As a result, it is impossible for this method to really achieve the phase loss detection when the compressor or motor is operating after star-up.

SUMMARY

In view of the above, a phase loss detection device, a compressor including the same and a phase loss detection method are disclosed to at least partially suppress or even solve the above problems.

According to an aspect of the present disclosure, a phase loss detection device for a motor, comprising a signal converting circuit and a processor. The signal converting circuit is configured to convert respective voltage signals corresponding to respective phases of multiphase alternating current (AC) power monitored from the motor. The processor is configured to receive the converted voltage signals from the signal converting circuit and configured to calculate, based on the converted voltage signals, one or more phase angles between the respective voltage signals. The processor is configured to determine that phase loss occurs if any one or more of the calculated phase angles deviate from a nominal value of a corresponding phase angle of the multiphase AC power by a value higher than a predetermined threshold.

In the conventional scheme of detecting phase loss based on the presence or absence of voltage signals, missing a voltage signal of a certain phase may not be found because of an induced electromotive force generated by the motor in the missing phase. In contrast, according to embodiments of the present disclosure, even if there is an induced electromotive force, the phase loss detection is still feasible because the phase angle between the induced electromotive force and the other phases will deviate from the nominal value of the corresponding phase angle.

According to an embodiment of the present disclosure, a voltage signals may be a line voltage or a phase voltage of the motor. The AC power may be, for example, three-phase AC power, the nominal value of the phase angle between the respective phases may be 120°, and the threshold may be 4% of the nominal value.

According to an embodiment of the present disclosure, the processor may be configured to calculate the phase angle by: calculating a period of the voltage signals, determining a difference in time between any two of the voltage signals, and determining the phase angle between the two voltage signals based on the difference and the calculated period. In the following description, a time interval between two voltage signals is interchangeable with a phase angle between the two voltage signals. To reduce randomness of the measurement and ensure accuracy of the calculation, the processor may be further configured to perform average filtering on at least one of the period or the difference before calculating the phase angle.

The signal converting circuit may be configured to convert the voltage signals into a form suitable to be processed by the processor.

According to an embodiment of the present disclosure, the signal converting circuit may comprise a step-down circuit configured to reduce the voltage of the voltage signal to a voltage suitable for the processor. For example, the step-down circuit may comprise a voltage divider circuit.

According to an embodiment of the present disclosure, the signal converting circuit may comprise a pulse generator circuit configured to generate, based on the voltage signal, a pulse waveform with a same period and same phase as a waveform of the voltage signal.

For example, the pulse generator circuit may include an optocoupler having an input side photodiode configured to receive the voltage signal or a voltage proportional to the voltage signal, and an output side transistor configured to output, at an output node, a low level if the input side photodiode is on or to output a high level if the input side photodiode is off. It is possible to decouple the high voltage side from the low voltage side by the optocoupler.

According to another aspect of the present disclosure, compressor includes: a compression component configured to compress suctioned gas and discharge the compressed gas; a motor configured to drive the compression component; the above-mentioned phase loss detection device; and a protection switch configured to switch on to turn off the motor if the phase loss detection device detects phase loss. According to an embodiment of the present disclosure, the phase loss detection device can detect the voltage signals of the motor in the compressor. The compressor can be, for example, a scroll compressor.

According to yet another aspect of the present disclosure, a phase loss detection method for a motor includes: calculating, based on voltage signals corresponding to respective phases of multi-phase AC power monitored from the motor, one or more phase angles between the respective voltage signals; and determining that phase loss occurs if any one or more of the calculated phase angles deviate from a nominal value of a corresponding phase angle of the multiphase AC power by a value higher than a predetermined threshold.

According to embodiments of the present disclosure, phase loss protection can be achieved by detecting the voltage signals of the motor, without additional signals. The motor is protected from switching to high current operation or reverse operation due to the blocking caused by the phase loss. The phase loss detection mechanism according to the present disclosure is simple for implementation and low in cost, can be applied to a compressor protection module without changing the traditional wiring and installation configuration, providing competitiveness and cost performance of modular products.

BRIEF DESCRIPTION OF DRAWINGS

The above and other objectives, features and advantages of the present disclosure will become more apparent from the following description of embodiments of the present disclosure with reference to the accompanying drawing, in which.

Figure 1:
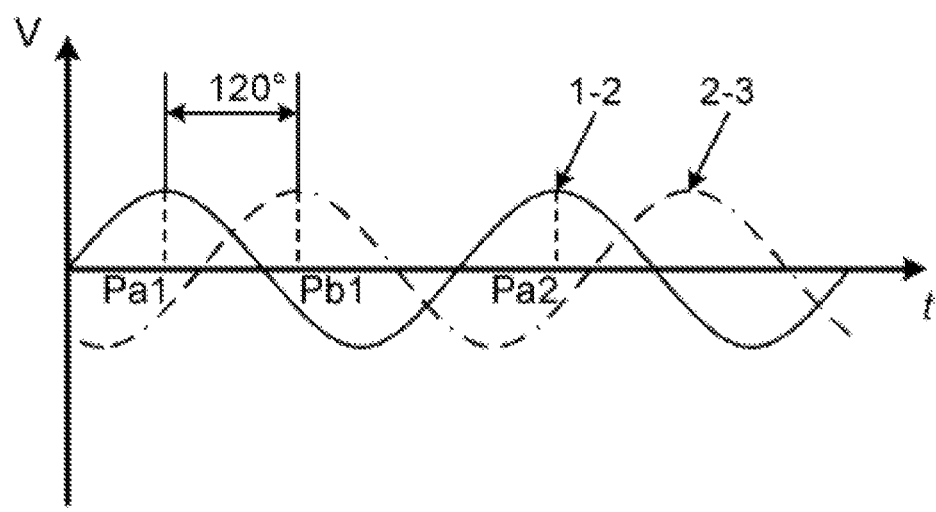
FIG. 1 is a schematic diagram illustrating a detection principle according to an embodiment of the present disclosure.

Throughout the figures, the same or similar components are denoted by the same or similar reference signs.

DETAILED DESCRIPTION

Hereinafter, embodiments of the present disclosure will be described with reference to the accompanying drawings. It should be understood, however, that these descriptions are for illustrative purposes only and are not to be construed as limiting the present disclosure. In addition, the description of well-known structures and technologies will be omitted to avoid unnecessary obscuring the concept of the present disclosure.

The terms used herein are for the purpose of describing specific embodiments only and are not intended to limit the present disclosure. The words "a", "an", "the" or the like as used herein shall also cover the meanings of "several" or "a plurality", unless the context clearly indicates otherwise. In addition, the terms "including", "comprising", or the like used herein indicate the presence of the features, steps, operations, and/or components, but do not exclude the presence of one or more other features, steps, operations, or components.

All terms (including technical and scientific terms) used herein have the meaning commonly understood by those skilled in the art unless otherwise defined. It should be noted that the terms used herein should be interpreted to have meanings consistent with the context of the specification, and should not be interpreted in an ideal or stereotype manner.

For multiphase alternating current (AC) power, such as AC power from a power grid, generally phase differences between phases are substantially constant. For example, for commonly used three-phase AC power, generally the phase differences between the respective phases are basically 120°. In the following description, the three-phase AC power is described as an example, but the present disclosure is not limited thereto.

When such AC power is applied to a motor, the motor can run, and voltage signals on the motor correspond to the AC power. If there is a phase loss while the motor is running, the voltage of the missing phase will be replaced by an induced electromotive force of the motor. However, the induced electromotive force and the voltages of the other two phases cannot satisfy the above described phase angle condition between the phases of the three-phase AC power. Therefore, it is possible to perform phase loss detection based on the phase angles between the voltage signals by monitoring the voltage signals of the respective phases from the running motor.

For example, under normal circumstances, the phase angle between the voltage signals of two phases is around 120°. The voltage signal may be a line voltage or a phase voltage of the motor. To tolerate impacts of various noises and detection accuracy, a certain threshold, such as 4% of the phase angle, can be set. Under the normal circumstances, the phase angle between two phases shall not deviate from 120° by a value higher than the threshold. If the deviation from the 120° phase angle (for example, above or below) exceeds the threshold, it can be determined that phase loss occurs.

FIG. 1 is a schematic diagram illustrating a detection principle according to an embodiment of the present disclosure, and more specifically, schematically illustrating a waveform of a line voltage 1-2 between the first phase and the second phase and a waveform of a line voltage 2-3 between the second phase and the third phase. The two line voltage signals have a phase difference of 120°. More specifically, in terms of time, an interval between the waveforms is the time corresponding to the phase difference of 120°, i.e., ⅓ of the period, for example, 20 ms/3≈6.7 ms in the case of 50 Hz power grid, or 16.67 ms/3≈5.6 ms in the case of 60 Hz power grid.

The interval between the two waveforms may refer to an interval between corresponding points of the two waveforms. The so-called "corresponding points" may refer to the same position in one period of the respective waveform, for example, the start position, ¼ position, ½ position, ¾ position, or end position within the period. This is consistent with the definition of a waveform interval in the art. In FIG. 1, the interval between the two waveforms is measured as an interval between middle time Pa1 and Pb1 of the respective first half periods of the two waveforms. Ideally, the middle time Pa1 and Pb1 may correspond to peak points respectively. Certainly, the waveform interval can also be measured as an interval between middle time of the respective second half periods (ideally, corresponding to trough points), or as an interval between zero crossing points, or the like. Based on the waveform interval and the signal period, the phase angle can be determined. For example, the waveform interval of ⅓ period corresponds to a phase angle of 120°.

A detection algorithm can be made according to the above principle as long as data representing the waveform, especially temporal positions of the waveform (such as waveform samples) are provided for the algorithm. The design of hardware can be greatly simplified.

Figure 2:
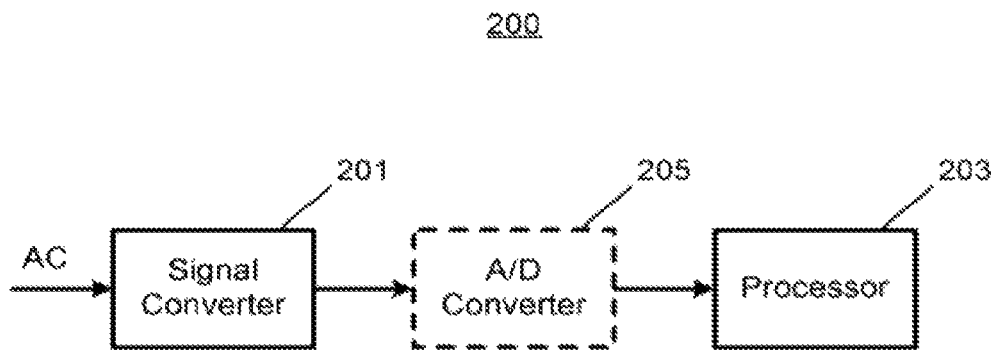
FIG. 2 is a schematic block diagram illustrating a phase loss detection device according to an embodiment of the present disclosure.

FIG. 2 is a schematic block diagram illustrating a phase loss detection device according to an embodiment of the present disclosure.

As shown in FIG. 2, the phase loss detection device 200 according to the embodiment may include a signal converting circuit 201 and a processor 203.

The signal converting circuit 201 may be configured to convert respective voltage signals corresponding to the respective phases of the three-phase AC power detected from the motor (as shown by "AC" in FIG. 2). Generally, the AC power, especially in applications such as compressors or motors, has a relatively high voltage (for example, 220V or 380V), while the processor 203 can withstand a relatively low voltage (for example, 5V or lower) when implemented as a logic device such as a microprocessor. Therefore, the signal converting circuit 201 is needed in order to convert the voltage signals to signals suitable for the processor, for example, to make voltage conversion to lower down the voltage signals of the AC power to a range that the processor 203 can tolerate.

According to embodiments of the present disclosure, the signal converting circuit 201 can not only perform voltage reduction, but also carry out waveform conversion. For example, the signal converting circuit 201 may include a pulse generator circuit configured to generate, based on the voltage signals, pulse waveforms (for example, substantially square wave signals) with the same period and same phase as the respective waveforms of the respective voltage signals. Because a pulse waveform has a steep profile, it is advantageous for phase detection or temporal position detection. A pulse waveform and its corresponding waveform before the conversion can be substantially aligned in time, that is, they are in-phase, so the pulse waveform can reflect the phase or temporal position of the waveform of the corresponding voltage signal, and can therefore be used for the phase loss detection.

Figure 3:
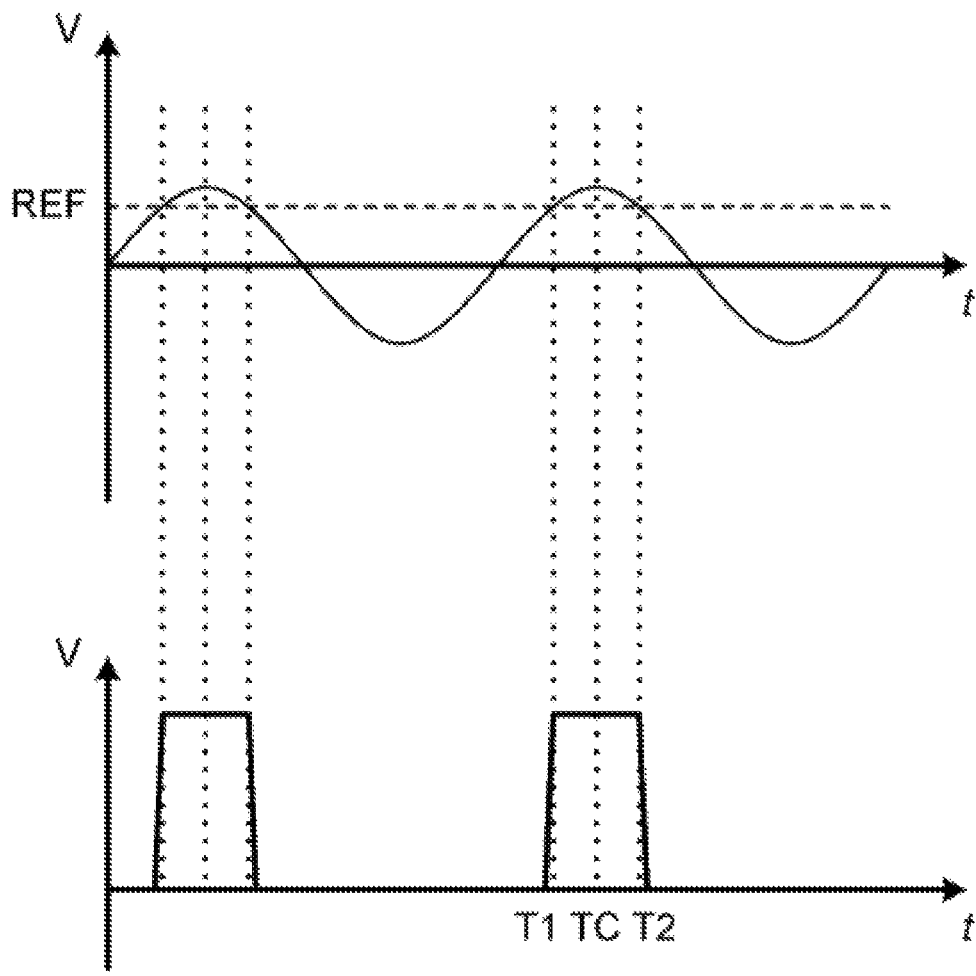
FIG. 3 is a schematic diagram illustrating an example of waveform generation according to an embodiment of the present disclose.

FIG. 3 is a schematic diagram illustrating an example of waveform generation according to an embodiment of the present disclosure.

As shown in FIG. 3, in this example, a square wave pulse sequence is generated based on a waveform of a line voltage. Specifically, the pulse may be generated based on a portion of the line voltage with an amplitude V exceeding a predetermined threshold REF. Thereby, each pulse in the pulse sequence has a substantially same time period as a corresponding peak portion of the line voltage waveform. a rising edge and falling edge of a square wave may have a certain slope respectively due to some delay in a circuit component. The threshold REF is adjustable.

The pulse generator circuit may have different configurations. For example, the pulse generator circuit may generate a pulse sequence corresponding in time to trough portions of the line voltage waveform, for example, by generating a pulse based on a portion of the line voltage with an amplitude V being lower than a predetermined negative threshold.

The line voltages 1-2 and 2-3 are similar, that is, they should have the same waveform in principle without considering noise and phase difference. Thus, the line voltages 1-2 and 2-3 applied to the same pulse generator circuit will generate respective pulse waveforms whose relative positional relationship in time coincide with the waveforms of the line voltages 1-2 and 2-3, regardless of the specific configuration of the pulse generator circuit.

Figure 4:
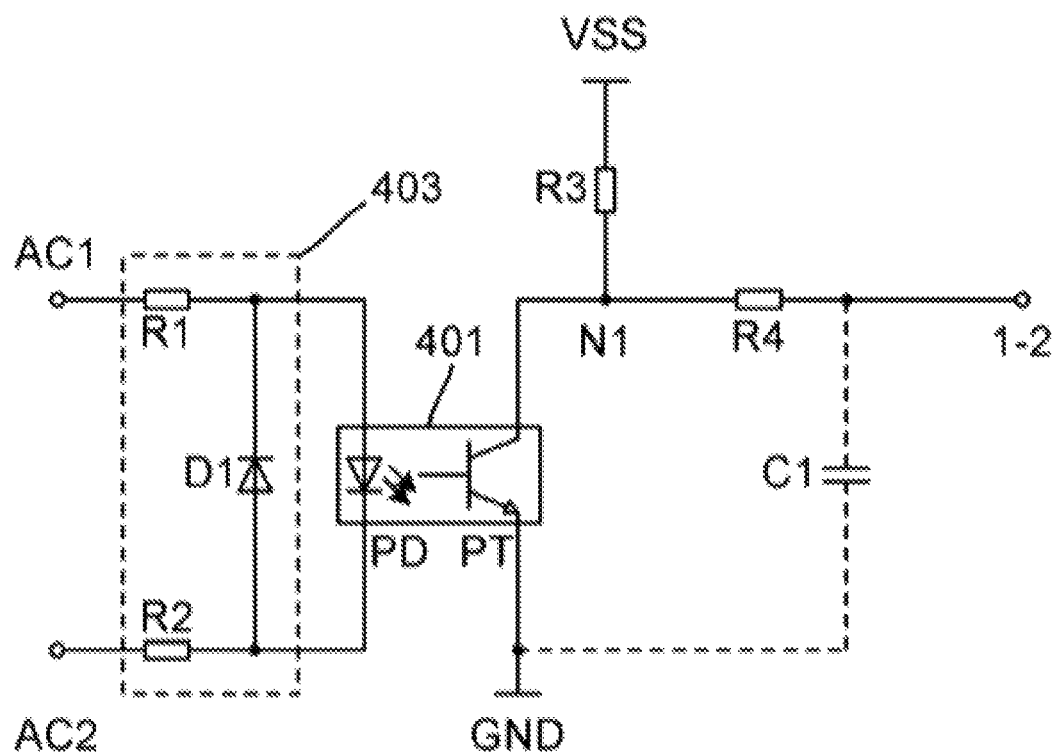
FIG. 4 is a circuit diagram illustrating an example of a pulse generator circuit according to an embodiment of the present disclosure.

FIG. 4 is a circuit diagram illustrating an example of a pulse generator circuit according to an embodiment of the present disclosure.

As shown in FIG. 4, the pulse generator circuit 400 according to the embodiment may include a comparator device 401 configured to compare a line voltage (for example, a line voltage of a first phase AC1 with respect to a second phase AC2) with a threshold voltage REF. Based on the magnitude relationship between the line voltage and the threshold voltage REF, the comparator device 401 may have different outputs. In this example, considering the possible high voltage of the AC power (for example, 220V or 380V), an optocoupler with an isolation function is used as the comparator device 401. The optocoupler includes an input side photodiode PD and an output side transistor PT. If the line voltage is greater than the threshold voltage REF, the voltage applied across the input side photodiode PD of the optocoupler 401 can turn on the photodiode PD and thus turn on the output side transistor PT. On the other hand, if the line voltage is less than the threshold voltage REF, the voltage applied across the input side photodiode PD of the optocoupler 401 is not enough to turn on the photodiode PD and thus turn off the output side transistor PT.

The input side photodiode PD can receive the line voltage through a voltage divider circuit 403. The voltage divider circuit 403 includes voltage dividing resistors R1 and R2. It is possible to adjust a voltage dividing ratio of the voltage divider circuit 403 by adjusting resistance values of the voltage dividing resistors R1 and R2, and thus to adjust the above threshold voltage REF.

In addition, a diode D1 is connected in series on the input side to prevent reverse current from flowing through the photodiode PD.

On the output side of the optocoupler 401, different signals, such as high and low level signals, may be output based on the on or off state of the output side transistor PT. There are various circuit designs in the art to achieve this purpose. In an example, the output side transistor PT has one end connected to a power supply voltage VSS through a pull-up resistor R3, and the other end connected to a reference voltage such as a ground voltage GND. As such, at an output node N1 of the transistor PT, a low level (approximately the ground voltage GND) is output if the transistor PT is on (that is, if the line voltage is greater than the threshold voltage REF), and a high level (approximately the power supply voltage VSS) is output if the transistor PT is off (that is, if the line voltage is less than the threshold voltage REF). The output node N1 of the transistor PT is connected to an output 1-2 via a resistor R4, thereby outputting a pulse transitioned accordingly between the high and low levels at the output 1-2.

It should be noted here that the pulse output by the pulse generator circuit 400 shown in FIG. 4 and the pulse shown in FIG. 3 are logically opposite to each other. In FIG. 3, a high level pulse is output if the line voltage is greater than the threshold voltage REF, while in FIG. 4, a low level pulse is output if the line voltage is greater than the threshold voltage REF. However, this does not affect the phase angle detection. A phase inverter may also be introduced downstream the pulse generator circuit 400 to have the same logic as shown in FIG. 3.

In addition, a filter capacitor C1 may be provided between the node N1 and the output of the pulse generator circuit 400.

Figure 5A:
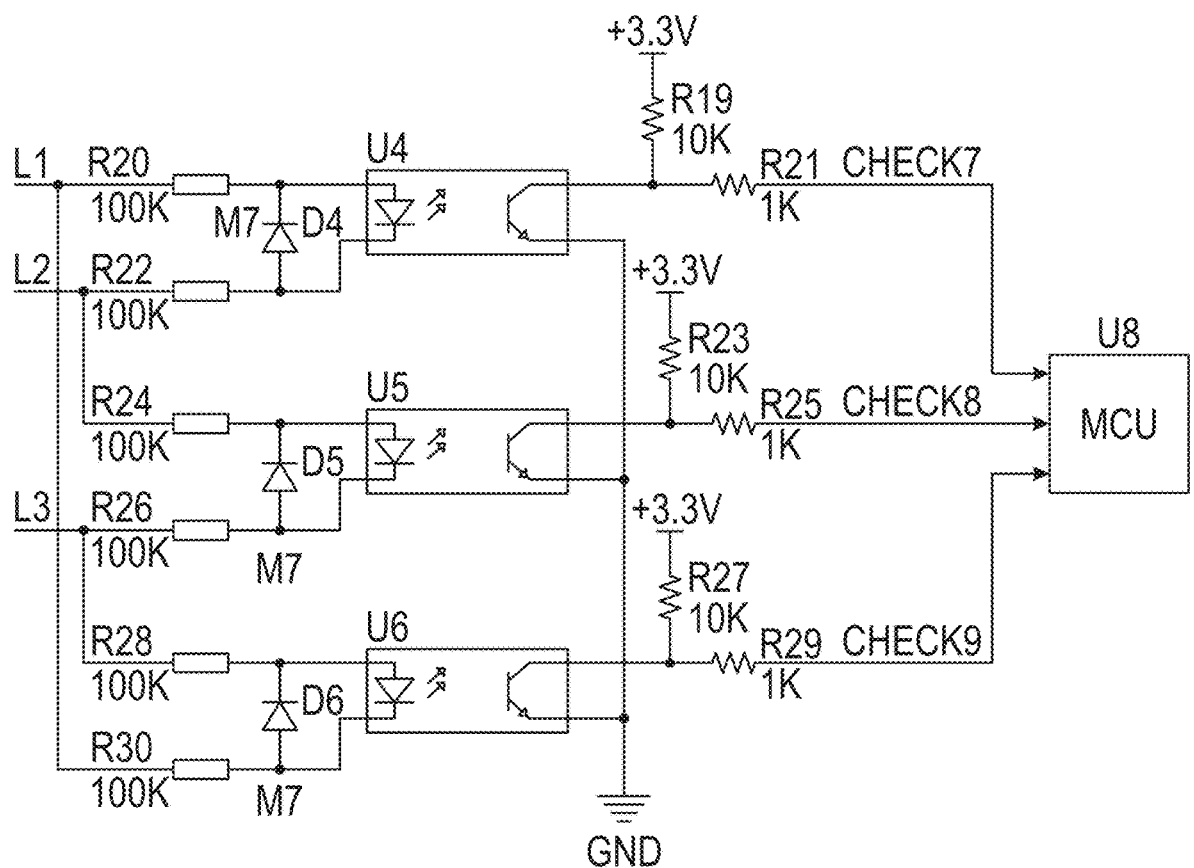
FIGS. 5(a) and 5(b) illustrate examples of pulse generator circuits according to embodiments of the present disclosure, respectively.
Figure 5B:
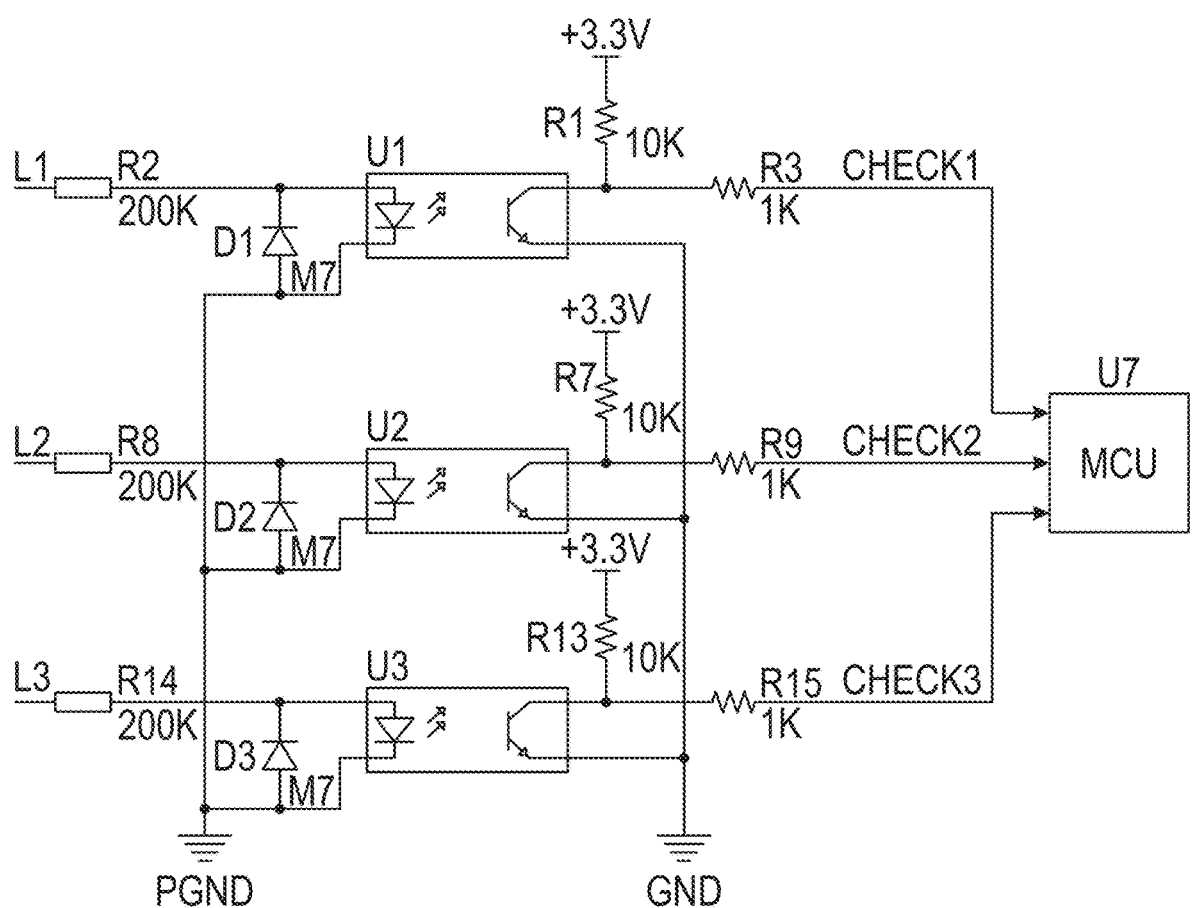

FIGS. 5 (a) and 5 (b) show examples of pulse generator circuits respectively. FIG. 5 (a) shows that a line voltage is input to a processor (for example, an MCU) after passing through the pulse generator circuit. FIG. 5 (b) shows that a phase voltage is input to a processor (for example, an MCU) after passing through the pulse generator circuit.

Figure 6:
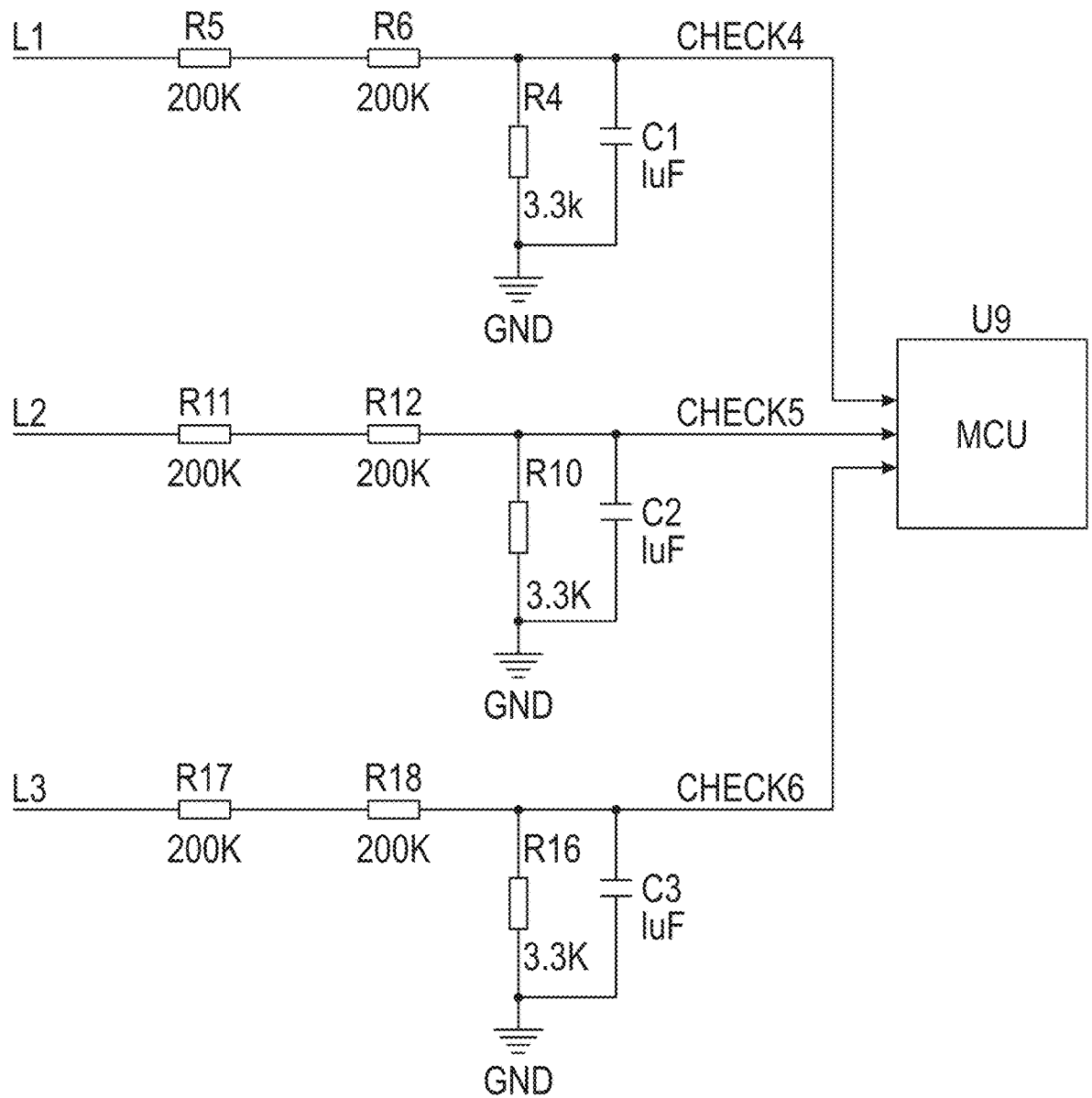
FIG. 6 illustrates an example of a step-down circuit according to an embodiment of the present disclosure.

According to an embodiment of the present disclosure, the signal converting circuit 201 may simply lower down a voltage signal, to be adapted to a specification of the processor 203. For example, a voltage step-down circuit may include a voltage divider circuit formed by resistors. FIG. 6 illustrates an example of such a step-down circuit. In FIG. 6, it is shown that phase voltages are input to a processor (for example, an MCU) after being reduced.

Returning to FIG. 2, the processor 203 may calculate, based on the voltage signals converted by the signal converting circuit, a phase angle between the respective voltage signals, and determine whether phase loss occurs or not accordingly. For example, the processor 203 may calculate, based on the waveforms of the voltage signals, such as the pulse waveforms generated by the pulse generator circuit described above, a time interval between the respective waveforms of the line voltages (for example, between 1-2 and 2-3 shown in FIG. 1), and determine whether phase loss occurs based on the interval with reference to the principle described above as well as FIG. 1. Such calculation and determination can be performed by, for example, programs or algorithms.

As described above, the processor 203 may calculate the phase angle based on the time interval between the voltage signals in combination with the period of the voltage signals.

In some applications, the period of the AC power may be fixed, such as 20 ms for 50 Hz or 16.67 ms for 60 Hz. In this case, such a fixed period may be preset in the processor 203. Alternatively, for the sake of universality, the processor 203 may determine the period based on the voltage signals. For example, the processor 203 may determine the period of a same single voltage signal based on an interval between corresponding points in two periods of the waveform of this voltage signal (referring to Pa1 and Pa2 of the line voltage 1-2 in FIG. 1). As described above, such corresponding points may be peak points, trough points, zero crossing points, or the like. Period detection based on zero crossing points can be advantageous, especially in the case of analog signals.

The processor 203 may determine the period based on corresponding points in two adjacent periods of the waveform of a same voltage signal, and the interval between those two points corresponds to one period. Alternatively, the processor 203 may determine the period based on corresponding points in any two periods, which are separated from each other by several periods, of the waveform of the voltage signal, and the interval between those two points corresponds to several periods. The period may be calculated for several times, for example, continuously or at a certain interval. The final period may be an average of the periods obtained for several times.

In addition, different voltage signals may have their respective periods (which should be the same in theory) determined separately, and these periods may be averaged to obtain a final period.

For different voltage signals, an interval therebetween may be determined based on an interval between corresponding points in corresponding periods of their respective waveforms. If the interval between the two corresponding points does not exceed one period, the two points can be considered to be in the corresponding periods. As described above, such corresponding points may be peak points, trough points, zero crossing points, or the like. Interval detection based on zero crossing points may be advantageous, especially in the case of analog signals.

Referring to FIG. 3, in an example, a pulse may have middle time TC of its duration as a flag of its temporal position. In an ideal case, the middle time TC may correspond to a peak point of the line voltage waveform. The middle time TC of the pulse may be calculated based on time T1 where a rising edge of the pulse is located and time T2 where a falling edge is located, for example, TC=(T1+T2)/2. The rising and falling edges of the pulse have steep profile, and thus their respective time is relatively easy to be detected with a high precision.

Figure 7:
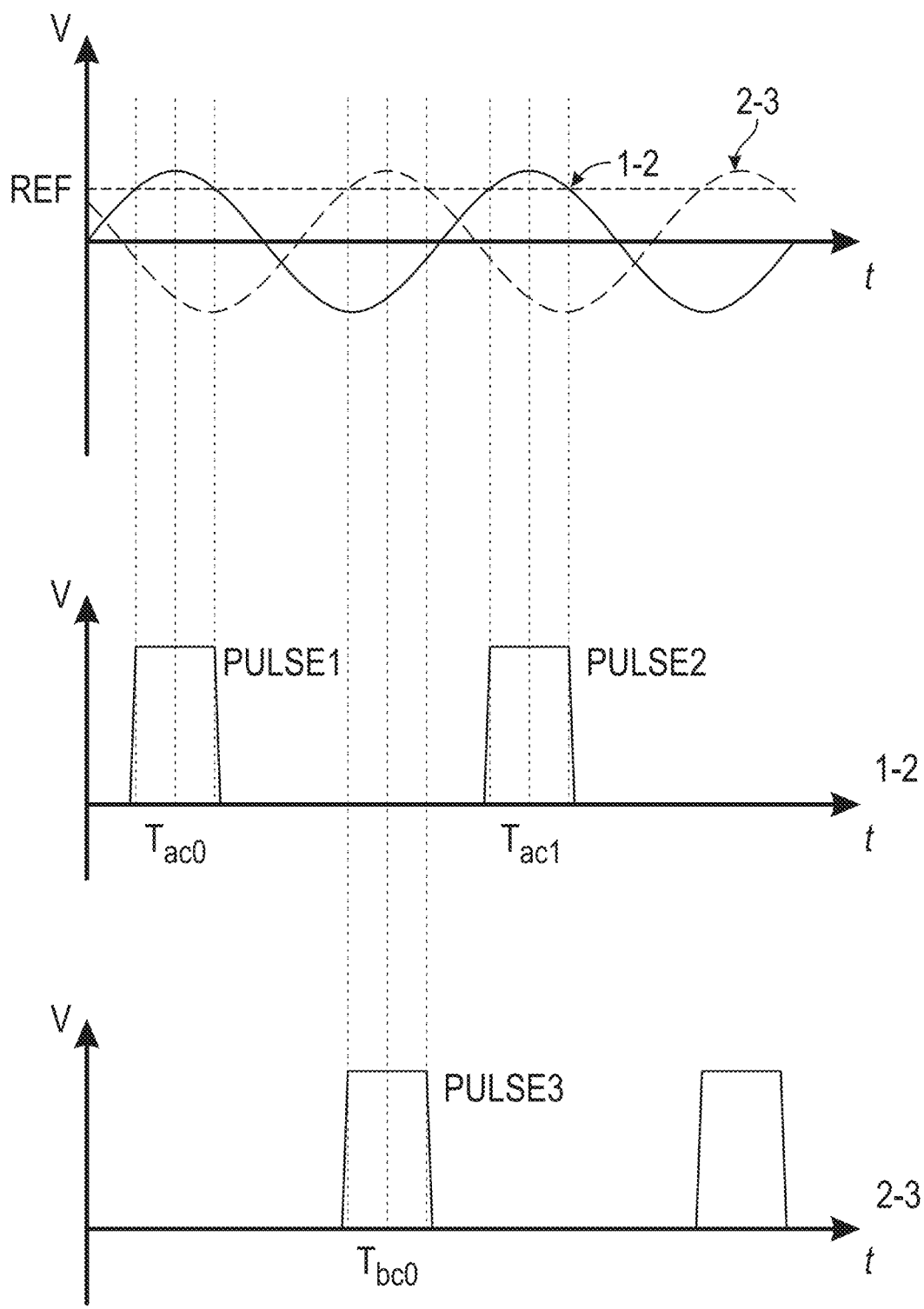
FIG. 7 is a schematic diagram illustrating a detection algorithm principle according to an embodiment of the present disclosure.

FIG. 7 is a schematic diagram illustrating a detection algorithm principle according to an embodiment of the present disclosure.

As shown in FIG. 7, two line voltages 1-2 and 2-3 in the case of three-phase AC power are taken as an example. FIG. 7 shows the waveforms of these two line voltages deviate from the normal interval (120° as described above). The waveforms of the line voltages 1-2 and 2-3 are converted into pulse waveforms by, for example, the pulse generator circuit described above. Phase loss detection may be performed based on the time interval of these waveforms.

Only several pulses adjacent in time need be detected. In the example of FIG. 7, two adjacent pulses PULSE1 and PULSE2 in the pulse waveform corresponding to the line voltage 1-2 and an adjacent pulse PULSE3 between the two pulses PULSE1 and PULSE2 in the pulse waveform corresponding to the line voltage 2-3 are selected. In practice, it is possible to start to detect the pulse PULSE3 only if the pulse PULSE1 is recognized. If the pulse PULSE1 is not recognized, the detection may not be started, because in this case there is at least a problem in the line voltage 1-2. And if the state where the pulse PULSE1 cannot be recognized continues more than a certain time interval (for example, the duration of one period), an error can be reported.

In the case where these three pulses PULSE1, PULSE2 and PULSE3 are detected, their temporal positions may be calculated, for example, based on their respective middle time Tac0, Tac1, and Tbc0. The intervals between these middle time may be used to calculate the period and the interval between the waveforms. For example, the period may be calculated as (Tac1−Tac0), and the waveform interval may be calculated as (Tbc0−Tac0). The phase angle may be calculated as [(Tbc0−Tac0)/(Tac1−Tac0)]*360°.

According to an embodiment of the present disclosure, average filtering may be performed for the period and the waveform interval before the calculation of the phase angle.

The processor 203 may be various apparatus or devices capable of running executable codes, for example, a programmable device such as a field programmable gate array (FPGA), a microprocessor (μP), or a micro control unit (MCU). The executable codes may be fixed into the processor 203 or may be loaded into the processor 203 from the external.

The phase loss detection device 200 may further include an analog-to-digital (A/D) converter 205 configured to convert an analog output from the signal converting circuit 201 into a digital form to be processed by the processor 203. The signal converting circuit 201 itself may also be designed in a digital form, or the A/D converter 205 may be incorporated into the processor 203.

Figure 8:
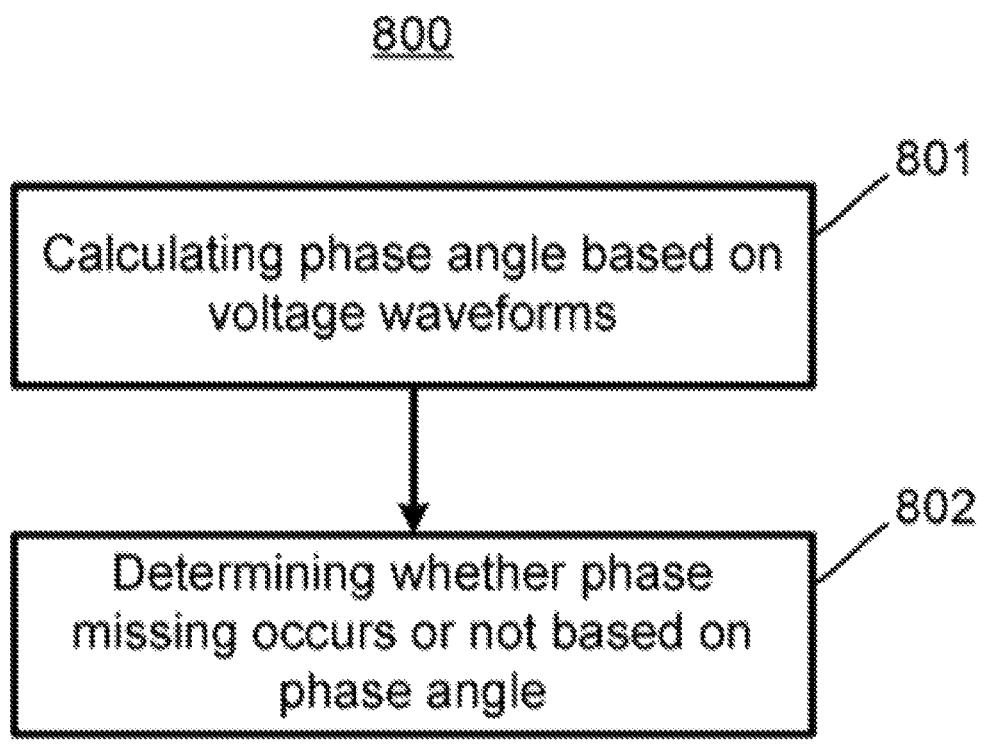
FIG. 8 is a flow diagram illustrating a phase loss detection method according to an embodiment of the present disclosure.

FIG. 8 is a flow diagram illustrating a phase loss detection method according to an embodiment of the present disclosure.

As shown in FIG. 8, the method 800 according to the embodiment may include calculating a phase angle based on waveforms of voltage signals at 801. The phase angle may be calculated based on a time interval between the waveforms as well as a period of a voltage signal as described above.

At 802, whether phase loss occurs or not may be determined based on the calculated phase angle. This determination may be made by software or algorithms as described above.

According to an embodiment of the present disclosure, the phase loss detection device or method may be applied to a compressor. When phase loss is detected, a protection switch may be switched on to turn off a motor in the compressor so as to protect the motor and the compressor. The compressor may be a scroll compressor, a reciprocating compressor, or the like. Taking a scroll compressor as an example, when phase loss occurs, the motor will still have an electromotive force, but the motor cannot drive a load to operate normally at this time, and as a consequence, other components inside the compressor may drag the motor to run, and the other components inside the compressor, such as the scroll, are damaged. According to an embodiment of the present disclosure, the compressor is a fixed-frequency compressor.

Figure 9:
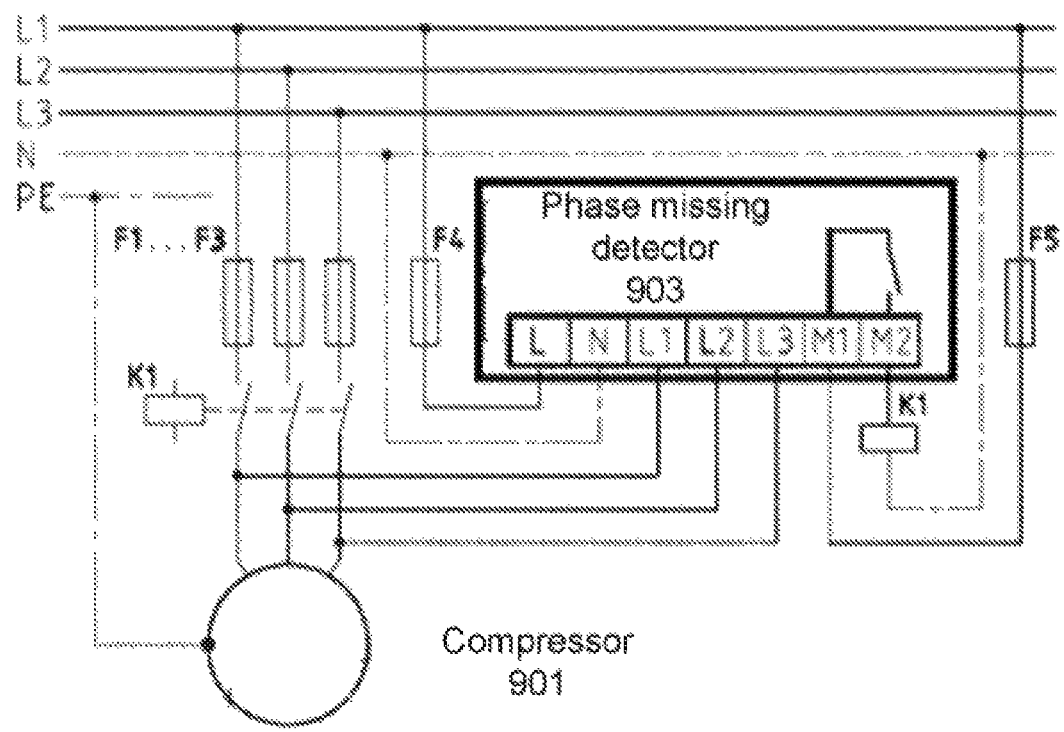
FIG. 9 is a schematic diagram illustrating circuit connections of a phase loss detection device for a compressor according to an embodiment of the present disclosure.

FIG. 9 is a schematic diagram illustrating a circuit of a phase loss detection device for a compressor according to an embodiment of the present disclosure.

As shown in FIG. 9, a compressor 901 receives power through power supply lines from, for example, a power grid. The power grid provides, for example, 220V or 380V AC power, including three phase lines L1, L2, L3 and a null line N. A contactor K1 is provided between the compressor 901 and the power supply to realize on/off control of the compressor 901. The compressor 901 may have a shell, and the shell may be connected to Protective Earth (PE).

Voltage signals of respective phases monitored from a motor in the compressor 901 are sent to monitoring ports L1, L2, L3 of a phase loss detection device 903, respectively. In addition, power ports L and N of the phase loss detection device 903 may be connected to the power supply to receive power for its own operation. The phase loss detection device 903 may be configured as described above, and more specifically, determine whether phase loss occurs or not based on the motor voltage signals on the monitoring ports L1, L2, and L3. If phase loss is detected, a protection switch may be turned on through output ports M1 and M2. In the configuration shown in FIG. 9, the protection switch is switched on, and the contactor K1 can disconnected the power supply from the compressor 901.

In the configuration of FIG. 9, the phase loss detection device 903 can operate only after the compressor 901 is started (i.e., the contactor K1 is connected), because after then the voltage signals can be monitored from the motor. The phase loss detection device 903 may be provided inside the shell of the compressor 901.

Fuses F1-F3, F4, and F5 on the respective lines in FIG. 9 are mainly configured to provide protection against short circuit and overcurrent.

According to embodiments of the present disclosure, the phase loss detection can be performed based on the voltage signals, thereby eliminating the need for additional components such as current sensors. In addition, the detection can be performed continuously, not only when the compressor is being started, so that the motor and the compressor can be protected better.

The embodiments of the present disclosure have been described above. However, these embodiments are for illustrative purposes only, and are not intended to limit the present disclosure. Although the embodiments have been described separately above, this does not mean that the measures in the respective embodiments cannot be used advantageously in combination. The scope of the present disclosure is defined by the claims and their equivalents. Without departing from the scope of the present disclosure, those skilled in the art can make various substitutions and modifications, all of which should fall within the scope of the present disclosure.

What is claimed is:

1. A phase loss detection device for a motor in a compressor, wherein the phase loss detection device is provided inside a shell of the compressor, comprising:
    a monitoring port, configured to receive a respective voltage signal corresponding to a respective phase of multiphase AC power monitored from the motor;
    a signal converting circuit configured to convert the respective voltage signal; and
    a processor configured to receive the voltage signal converted from the signal converting circuit and configured to:
        calculate, based on the voltage signal converted, one or more phase angles between voltage signals; and
        determine that phase loss occurs if any one or more of the phase angles deviate from a nominal value of a corresponding phase angle of the multiphase AC power by a value higher than a predetermined threshold;
    wherein
    the monitoring port is configured to receive a first voltage signal corresponding to a first phase of the multiphase AC power monitored from the motor, a second voltage signal corresponding to a second phase of the multiphase AC power monitored from the motor, a third voltage signal corresponding to a third phase of the multiphase AC power monitored from the motor;
    the signal converting circuit comprises:
    a first optocoupler, configured to receive at its anode end the first voltage signal through a first resistance, and to receive at its cathode end the second voltage signal through a second resistance, and configured to output a low-level if its input diode is on and to output a high-level if its input diode is off;
    a second optocoupler, configured to receive at its anode end the second voltage signal through a third resistance, and to receive at its cathode end a third voltage signal through a fourth resistance, and configured to output a low-level if its input diode is on and to output a high-level if its input diode is off; and
    a third optocoupler, configured to receive at its anode end the third voltage signal through a fifth resistance, and to receive at its cathode end the first voltage signal through a sixth resistance, and configured to output a low-level if its input diode is on and to output a high-level if its input diode is off.

2. The phase loss detection device according to claim 1, wherein the voltage signal is one of a phase voltage and a line voltage of the motor.

3. The phase loss detection device according to claim 1, wherein the multiphase AC power is three-phase AC power, the nominal value is 120°, and the threshold is 4% of the nominal value.

4. The phase loss detection device according to claim 1, wherein the processor is configured to calculate the phase angle by:
  calculating a period of the voltage signal;
  determining a difference in time between any two voltage signals, and determining the phase angle between the two voltage signals according to the difference and the calculated period.

5. The phase loss detection device according to claim 1, wherein the signal converting circuit comprises a pulse generator circuit configured to generate, based on the voltage signal, a pulse waveform with a same period and same phase as a waveform of the voltage signal.

6. The phase loss detection device according to claim 5, wherein the pulse generator circuit comprises:
  an optocoupler comprising: an input side photodiode configured to receive the voltage signal or to receive a voltage proportional to the voltage signal, and an output side transistor configured to output, at an output node, a low level if the input side photodiode is on, or to output a high level if the input side photodiode is off.

7. A compressor, comprising:
  a compression component configured to compress suctioned gas and discharge the compressed gas;
  a motor configured to drive the compression component;
  a phase loss detection device recited in claim 1; and
  a protection switch configured to switch on to turn off the motor if the phase loss detection device detects phase loss.

8. The compressor according to claim 7, wherein the compressor is a scroll compressor, wherein, the motor is connected to power supply through a contactor K1, and wherein the monitoring port is configured to receive the respective voltage signal from a connecting node between the contactor and the motor;
  wherein the phase loss detection device further comprises a protection switch, arranged in a power supply line through the contactor, and wherein if phase loss is detected, the protection switch is configured to be "on" in order to enable the contactor to disconnect power from the power supply to the motor.

9. The phase loss detection device of claim 1, wherein:
  the phase loss detection device is able to detect whether the motor has phase loss during running of the compressor.

10. A compressor comprising:
  a shell; and
  the phase loss detection device of claim 1;
  wherein the phase loss detection device is provided inside the shell of the compressor.

11. The phase loss detection device of claim 1, further comprising:
  a first diode (D4) connected in parallel with the first optocoupler input diode at an opposition direction;
  a second diode (D5) connected in parallel with the second optocoupler input diode at an opposition direction; and
  a third diode (D6) connected in parallel with the second optocoupler input diode at an opposition direction.

12. A compressor, comprising:
  a compression component configured to compress suctioned gas and discharge the compressed gas;
  a motor configured to drive the compression component;
  a phase loss detection device according to claim 1; and
  a protection switch configured to switch on to turn off the motor if the phase loss detection device detects phase loss;
  wherein the phase loss detection device recited in claim 1 comprises a signal converting circuit configured to convert a respective voltage signal corresponding to a respective phase of multiphase AC power monitored from the motor; and
  a processor configured to receive the voltage signal converted from the signal converting circuit and configured to:
    calculate, based on the voltage signal converted, one or more phase angles between voltage signals; and
    determine that phase loss occurs if any one or more of the phase angles deviate from a nominal value of a corresponding phase angle of the multiphase AC power by a value higher than a predetermined threshold.

13. The compressor according to claim 12, wherein the voltage signal is one of a phase voltage and a line voltage of the motor.

14. The compressor according to claim 13, wherein the compressor is a scroll compressor.

15. The compressor according to claim 14, wherein the compressor is a fixed-speed scroll compressor.

16. The compressor according to claim 12, wherein the compressor is a scroll compressor, wherein, the motor is connected to power supply through a contactor K1, and wherein the monitoring port is configured to receive the respective voltage signal from a connecting node between the contactor and the motor;
  wherein the phase loss detection device further comprises a protection switch, arranged in a power supply line through the contactor, and wherein if phase loss is detected, the protection switch is configured to be "on" in order to enable the contactor to disconnect power from the power supply to the motor.

17. A phase loss detection method for a motor in a compressor, comprising:
  receiving, at a phase loss detection device provided inside a shell of the compressor, a respective voltage signal corresponding to a respective phase of multiphase AC power monitored from the motor;
  calculating, based on the respective voltage signal from the motor, one or more phase angles between voltage signals; and
  determining that phase loss occurs if any one or more of the phase angles deviate from a nominal value of a corresponding phase angle of the multiphase AC power by a value higher a predetermined threshold;
  wherein the phase loss detection device comprises:
  a monitoring port, configured to receive a first voltage signal corresponding to a first phase of the multiphase AC power monitored from the motor, a second voltage signal corresponding to a second phase of the multiphase AC power monitored from the motor, a third voltage signal corresponding to a third phase of the multiphase AC power monitored from the motor;
  a signal converting circuit, comprising:
  a first optocoupler, configured to receive at its anode end the first voltage signal through a first resistance, and to receive at its cathode end the second voltage signal through a second resistance, and configured to output a low-level if its input diode is on and to output a high-level if its input diode is off;
  a second optocoupler, configured to receive at its anode end the second voltage signal through a third resistance, and to receive at its cathode end a third voltage signal through a fourth resistance, and configured to output a low-level if its input diode is on and to output a high-level if its input diode is off; and a third optocoupler, configured to receive at its anode end the third voltage signal through a fifth resistance, and to receive at its cathode end the first voltage signal through a sixth resistance, and configured to output a low-level if its input diode is on and to output a high-level if its input diode is off.

18. The phase loss detection method according to claim 17, wherein the voltage signal is a phase voltage or a line voltage of the motor.

19. The phase loss detection method according to claim 17, wherein the multiphase AC power is three-phase AC power, the nominal value is 120°, and the threshold is 4% of the nominal value.

20. The phase loss detection method according to claim 17, wherein calculating the phase angle comprises:
 calculating a period of the voltage signal;
 determining a difference in time between any two voltage signals, and determining the phase angle between the two voltage signals according to the difference and the period.

* * * * *